United States Patent [19]

Pass et al.

[11] Patent Number: 5,510,173

[45] Date of Patent: Apr. 23, 1996

[54] MULTIPLE LAYER THIN FILMS WITH IMPROVED CORROSION RESISTANCE

[75] Inventors: Thomas Pass, Sunnyvale; Floyd E. Woodard, Los Altos, both of Calif.

[73] Assignee: Southwall Technologies Inc., Palo Alto, Calif.

[21] Appl. No.: 110,350

[22] Filed: Aug. 20, 1993

[51] Int. Cl.⁶ ................................................. B32B 17/06
[52] U.S. Cl. .................... 428/216; 359/360; 359/585; 359/589; 428/432; 428/433; 428/469; 428/472; 428/701; 428/702; 428/699; 428/697
[58] Field of Search .................... 428/469, 472, 428/216, 701, 702, 432, 433, 697, 699; 359/360, 585, 589

[56] References Cited

U.S. PATENT DOCUMENTS

| | | | |
|---|---|---|---|
| 4,234,654 | 11/1980 | Yatabe et al. | 428/333 |
| 4,337,990 | 7/1982 | Fan et al. | 350/1.7 |
| 4,413,877 | 11/1983 | Suzuki et al. | 350/1.7 |
| 4,497,700 | 2/1985 | Groth et al. | 204/192 P |
| 4,565,719 | 1/1986 | Phillips et al. | 428/216 |
| 4,786,563 | 11/1988 | Gillery et al. | 428/630 |
| 4,828,346 | 5/1989 | Jacobson et al. | 350/1.7 |
| 4,857,094 | 8/1989 | Groth et al. | 65/60.2 |
| 4,902,081 | 2/1990 | Huffer | 350/1.7 |
| 4,960,645 | 10/1990 | Lingle et al. | 428/432 |
| 4,973,511 | 11/1990 | Farmer et al. | 428/457 |
| 5,059,295 | 10/1991 | Finley | 204/192.27 |
| 5,071,206 | 12/1991 | Hood et al. | 359/360 |

FOREIGN PATENT DOCUMENTS 0464789  1/1992  European Pat. Off. .

Primary Examiner—A. A. Turner
Attorney, Agent, or Firm—Burns, Doane, Swecker & Mathis

[57] ABSTRACT

The durability of thin metal coatings and particularly substantially transparent copper and silver plus noble metal coatings and their ability to withstand corrosive environments is improved by overcoating the metal layers with a double coating of dielectric. The first coating is made up of dielectric based on indium and/or zinc. The second coating is made up of dielectric based on indium and tin. These overcoatings are more effective than a single coating based on one metal or a single coating based upon the two metals.

17 Claims, 4 Drawing Sheets

MULTIPLE LAYER THIN FILMS WITH IMPROVED CORROSION RESISTANCE

BACKGROUND OF THE INVENTION

1. Field of the Invention

This invention relates to multilayer metallized films which have selective energy transmission and reflection characteristics. More particularly, it concerns improvements to energy reflective/transmissive metal/dielectric films which lead to improved durability and corrosion resistance for such films.

2. Description of the Prior Art

Since at least the 1950's efforts have been made to come up with materials which will selectively interfere with the passage of particular types of energy. For example, there are numerous applications where one wishes to allow visible and near infrared light to pass though a material while retaining far infrared radiation (heat). These materials find application in the areas of architectural glazings, furnace windows, goggles, and automotive glazings. Similarly, there are other applications where one desires to allow visible light to pass while blocking the passage of radio frequency waves or other forms of electromagnetic radiation. These materials find application in the areas of high security architectural glazings, CRT shields, and the like.

Over the years the sophistication of these products has increased dramatically. In the area of heat rejection, early work focussed on absorbing the heat and preventing its transmission. Pigments and dyes were added to the body of glazing materials to accomplish this. Metallic wires were embedded or applied to glazing sheets and then grounded to act as RF shields and the like.

More recently, it has been realized that one can apply thin films of metals to the surfaces of materials to achieve selective energy transmission. If these films are properly chosen they can serve as selective reflectors of certain types of electromagnetic radiation while transmitting others.

In the area of using metallic films as transparent heat reflectors, there has been substantial effort directed toward the use of multilayer films. Workers such as John C. C. Fan et al. in U.S. Pat. No. 4,337,990, pointed out that one could improve the overall selectivity of metallic films by accompanying them by one or more nonmetallic layers. These nonmetallic layers typically were inorganic metal compounds (i.e., dielectric materials) and were variously referred to as "antireflection layers," "phase matching layers" and the like.

Southwall Technologies Inc. has commercialized a range of products which include one or more transparent metal layers bounded on one or both sides by a dielectric layer. These materials have been developed for use as heat reflectors for window glazings and as radiation and interference shields for CRT's and other types of electronic equipment. While this type of product can be adapted to a wide range of applications, we have found that in certain settings, particularly settings which present a corrosive environment, the longevity of this type of metal/dielectric product could be improved.

This invention addresses this longevity problem and is directed to improving these metal/dielectric coatings and particularly coatings based on silver or copper metal in combination with indium- and/or zinc-based dielectrics.

STATEMENT OF THE INVENTION

We have now discovered that the longevity and durability of thin film products and the like having dielectric-bounded silver- or copper-containing metal layers is improved when at least the outermost of the dielectric bounding layers is laid down as two layers. The first of the two layers, that is the inner layer or the layer closer to the metal layer, is composed substantially of indium- and/or zinc-based dielectric. This layer is nonporous and continuous. The second (or outer) of the two layers is composed substantially of dielectric based on indium and tin.

This construct has improved environmental stability compared to materials which employ only a single outer boundary layer. This double layer dielectric finds primary application as an "overlayer" or outward facing layer in metal-film-containing products. Although not tested, it could also in theory be used as an underlayer beneath the metal layer where the first layer of dielectric would be adjacent to the metal layer and the indium/tin layer would be adjacent to a substrate. This aspect of the invention would have valuable application with substrates having a propensity to themselves corrode or otherwise undesirably interact with the metal layer or a propensity to transmit other corrosive agents in the environment.

The double layer dielectric could also be employed in spacer layers which are located between two metal layers in products which contain two or three or more metal layers. This structure is mentioned for completeness and could be of advantage if one of the metal layers constituted a source of corrosion or other interaction with another metal layer. In general, however, the dominant use of the double layer dielectrics of this invention is as boundary layers rather than as spacer layers.

The use of a multilayer dielectric layer with differing composition for the layers finds application in a wide range of metal-layer-containing sheet products. These include EMF or RF shields, reflectors for light and other electromagnetic radiation, as well as products having substantial degrees of transparency such as metal layer carrying glazing products or transparent electromagnetic shields or RF shields and the like.

BRIEF DESCRIPTION OF THE DRAWINGS

This invention will be described with reference being made to the drawings in which.

DETAILED DESCRIPTION OF THE INVENTION

Figure 1:
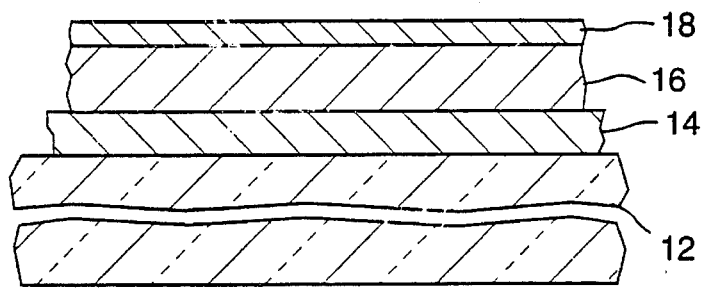
FIG. 1 is a schematic cross-section of a material employing the double dielectric layer of this invention.

This Detailed Description is arranged into the following parts:

Definitions
The First (or Under) Layer
The Second (or Outer) Layer
The Metal Layer Protected
Substrate Materials
Other Layers
Overall Structures of Products
Manufacturing Information

Definitions

"Composed substantially" or "substantially composed" is used when defining the makeup of the various layers in these materials. It serves to identify the majority constituents and numerically should be considered to identify the component or components which represent at least 90% and preferably at least 95% of the total up to 100% of the total.

"%" is also used when defining the makeup of the various layers in these materials "%", in this setting, means % by weight of a metal based on the total metal present. Thus a "50%/50% indium oxide/tin oxide" mixture would not be exactly 50% $In_2O_3$ and 50% $SnO_2$ but rather would be a mixed oxide based upon a 50% w/50% w mixture of indium and tin metal.

Dielectric materials will be referred to by their empirical formula, such as "$In_2O_3$" for indium oxide. It will be understood by those versed in this field that the degree of conversion of the metals to the dielectric form may sometimes be somewhat less than the 100% implied by the empirical formula (for example 90% conversion) without departing from the spirit of this invention.

The First (or Under) Layer

The first layer, that is the layer which is in contact with the metal layer, is formed from a dielectric composed substantially of zinc- and/or indium-based dielectric. This dielectric layer typically will have an index of refraction of at least about 1.9.

Oxides of indium (In), zinc (Zn) and mixtures thereof give good results. Thus, materials for the first layer can include $In_2O_3$, and $ZnO_2$. As already noted, these are empirical formulas, the actual materials may be somewhat less fully oxidized, say to 0.9 times empirical.

Other dielectric materials beyond those which "substantially compose" the layer, which can be present in amounts of up to about 10% (or up to 5% preferably), include dielectrics based on tantalum (Ta), niobium (Nb), titanium (Ti), hafnium (Hf), tungsten (W) zirconium (Zr) molybdenum (Mo) and silicon (Si), for example the oxides $Ta_2O_5$, $Nb_2O_5$, $TiO_2$, $HfO_2$, $WO_3$, $ZrO_2$, $MO_2O_5$ and $SiO_2$; and mixtures of these oxides with the nitrides $Ta_3N_5$, $Nb_3N_5$, $Ti_3N_4$, $Hf_3N_4$, $WN_2$, $Zr_3N_4$, $MO_3N_5$ and $Si_3N_4$.

These additional or "secondary" martials are typically substantially insoluble in the main dielectric components and can be present as impurities or as intentionally-added components. In some cases (particularly when there is a low degree of mutual solubility) these additional materials may have advantages of varying the crystalline/amorphous character of the dielectric layer.

At this time we prefer to use single metal oxides, that is $In_2O_3$, or $ZnO_2$ with $In_2O_3$ being the most preferred material for the first layer.

The first layer is at least about 100 angstroms thick. It can range up to about 900 angstroms in thickness subject to the limitation that the overall thickness of the "first" layer plus the "second" layer should not total over about 1000 angstroms for economy of preparation reasons. Preferred thicknesses for the first layer are from about 150 angstroms to about 750 angstroms and especially from about 200 angstroms to about 500 angstroms. When substantial transparency is desired, total thicknesses for the first plus second layer ranging from about 200 to 600 angstroms, give best results.

The Second (or Outer) Layer

The second layer, that is the layer which is not in contact with the metal layer, is composed substantially of mixed tin/indium-based dielectric, and particularly dielectrics based upon a 20%/80% to 80%/20% mixture or alloy of these two metals. This mixed dielectric should have an index of refraction of at least about 1.9.

Oxides of indium (In) and tin (Sn) give good results. This second layer can include the secondary metal-based dielectrics described above with reference to the first layer. These secondary metal-based materials can be present in the same amounts described there, that is up to 10% but preferably up to 5% of the total with the two primary materials being reduced proportionally.

At this time we prefer to use binary indium/tin oxides. 33%/67% to 67%/33% indium/tin oxides and especially about 50%/50% mixtures give very good results.

The second layer is at least about 25 angstroms thick. It can range up to about 900 angstroms in thickness subject to the already noted limitation that the overall thickness of the "first" layer plus the "second" layer should not total over about 1000 angstroms. Preferred thicknesses for the second layer are from about 25 angstroms to about 400 angstroms and especially from about 50 angstroms to about 200 angstroms.

In the case of products having desired optical properties, for example glazing materials, the overall thickness of the two-layer dielectric layer will play a part in the optical performance. In these cases it is often easiest to select the outer layer thickness in the above range and then adjust the total thickness of the combined layers within the area of the thickness used for single-layer dielectrics until optimal optics are achieved.

The Metal Layer Protected

The metal layer which is protected by having the double layer dielectric applied to it is typically made up predominantly of silver and/or copper. This layer may advantageously include minor amounts of gold, platinum or palladium either as alloyed material or as one or two separate cladding layers.

The most dramatic results are achieved with the multilayer dielectric layers when they are used in conjunction with silver or copper that is accompanied by minor amounts (from about 1% weight to about 20% weight) of gold or another noble metal. In these settings, the metal layer has improved corrosion resistance properties and the nature of the dielectric appears to be the corrosion rate-controlling element. With pure silver, the effect of this invention is less pronounced.

The metal layer can be any suitable thickness such as from 10 to 3000 angstroms, depending upon the application. In architectural and automotive window glazing settings, metal thickness can range from about 25 angstroms up to about 250 angstroms. (Thicker layers, such as up to about 1000 angstroms, can be used in this application if one is willing to accept substantial drops in visible light transmission or if one seeks a high degree of reflectance.) In the case of reflectors, RF shields, radiation shields, furnace windows, goggles and the like, the metal layer thickness can range up to several thousand angstroms, e.g. 3000 angstroms, if desired. The thickness of the metal layer is not seen as a controlling factor in the practice of this invention.

Substrate Materials

The multilayer dielectric materials of this invention and their accompanying metal layers are typically carried by a support or substrate.

The materials which are employed as substrates most commonly are substantially transparent plastic (polymer) film, plastic sheet, or sheets of glass, quartz or another inorganic material. Polymer materials and glass sheets are the most common support media.

Polymer materials include classic organic polymers such as polyesters and polycarbonates and fluorocarbon and fluorohydrocarbon materials as well. Representative organic polymers include polyesters such as poly(ethyleneterephthalate) ("PET"), polycarbonates, polyacrylates and methacrylates such as poly(methylmethacrylate) ("PMMA"), poly(methacrylate), poly(ethylacrylate) and copolymers such as poly(methylmethacrylate-co-ethylacrylate). Fluorocarbon polymers such as teflon can be used as well. Other polymers have indices of refraction below that of the antireflection coatings may be used, if desired.

Although not a limitation to the application of this invention, clear, transparent, and colorless polymer materials (i.e., plastic sheets, films, or bodies having integrated transmissions over the visual wavelengths of at least about 75% i.e., from about 70% to about 90% without marked absorption or reflection peaks in this range) yield particularly attractive final products.

The polymer substrates themselves are commercially available or can be prepared by various art-known processes.

These polymers may be presented in any form. These forms can include solid bodies, films, or coatings applied or laminated onto other surfaces such as metal or glass.

Other Layers

The multilayer products of this invention have been described with reference being made to a substrate, a metal layer and a two layer (first and second layer) overlayer. It will be understood that other layers may be present. For example, the metal layer may be preceded by one or more primer or adhesion-promoting layers. It may be followed by a capping layer of metal (which may be up oxidized to dielectric during subsequent processing steps, in some cases). Similarly, the overlayers may be treated with a hardcoat or other protective layer to add to the robustness of the product. While the use of these additional materials is clearly within the scope of this invention, they are not required.

Any of these structures can additionally include other optional layers such as adhesive layers to allow the products to be laminated into final products such as CRT shields, automotive windshields, and the like.

Overall Structures of Products

The multilayer dielectric materials of this invention find application in a variety of product structures. A very basic product structure is shown in FIG. 1 as product 10. This product includes a transparent glass or plastic substrate 12, a 100 angstrom thick silver/gold alloy metal layer 14 deposited on the substrate, a first layer 16 composed of about 250 angstroms of indium oxide and a second layer 18 about 50 angstroms thick and made up of a 50%/50% mixture of indium oxide and tin oxide. This product would find application as a heat reflective window glazing or, if the metal layer was grounded, as an interference filter, RF filter or other filter for placement in front of a CRT.

Figure 2:
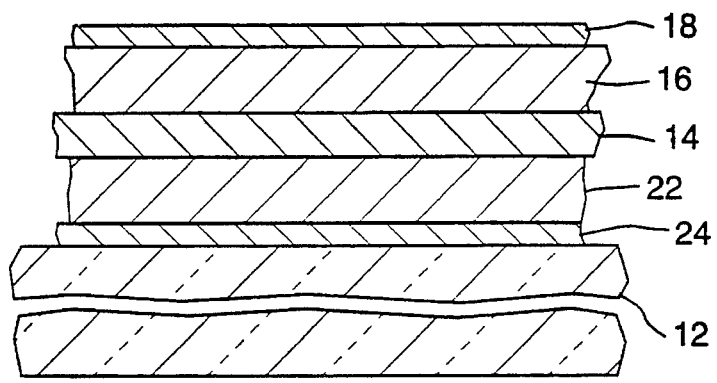
FIG. 2 is a schematic cross-section of a dielectric/metal/dielectric material employing two of the double dielectric layers of this invention.

A more involved product structure is shown in FIG. 2 as product 20. This product includes the same transparent glass or plastic substrate 12, a 100 angstrom thick silver/gold alloy metal layer 14, a first layer 16 composed about 250 angstroms of indium oxide and a second layer about 50 angstroms thick of a 50%/50% mixture of indium oxide and tin oxide. This product additionally contains a second multilayer dielectric under the metal layer 14. This second layer includes a first layer 22 composed of about 250 angstroms of indium oxide adjacent to the metal layer and a second layer 24 about 50 angstroms thick of a 50%/50% mixture of indium oxide and tin oxide between the first layer and the substrate. This product would find application as a heat reflective window glazing or, if the metal layer was grounded, as an EMI/RF shield for placement in front of a CRT.

Figure 3:
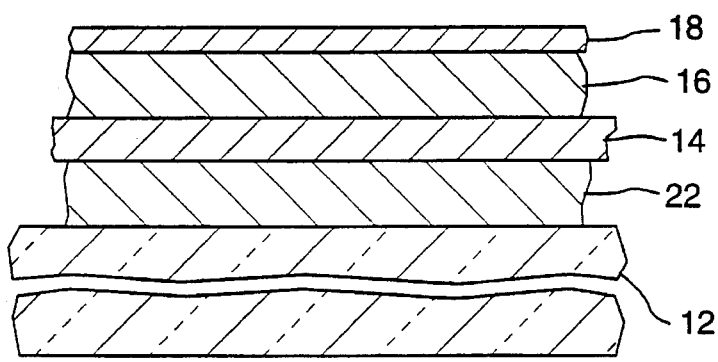
FIG. 3 is a schematic cross-section of a dielectric/metal/dielectric material employing the double layer dielectric of the invention only on the outside.

In actual practice, the advantages of the present multilayer dielectric layers are generally achieved when the outermost dielectric structure has the described multiple layers. Accordingly, as shown in FIG. 3 as product 30, in actual practice it is likely that layers 22 and 24 would be combined into a single indium oxide or indium/tin oxide layer 22. Circumstances where one might opt for the additional complexity of product 20, as compared to product 30, include when the substrate itself corrosively interacts with the metal layer and when the substrate is porous and permits substantial permeation of corrosive agents to the underlying dielectric boundary.

Figure 4:
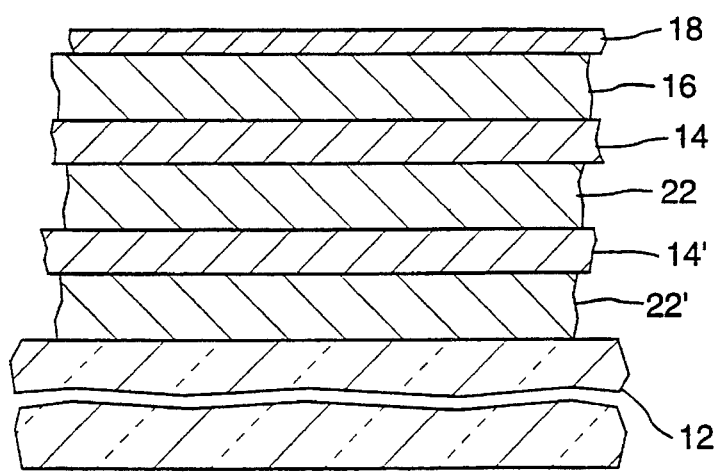
FIG. 4 is a schematic cross-section of a more involved material having more than one metal layer and employing the double dielectric layer of this invention.

A yet more involved product structure is shown in FIG. 4 as product 40. This product includes all the layers shown in FIG. 3 but includes a second metal layer 14' which is essentially identical to layer 14, except for variations in thickness. Metal layers 14 and 14' are separated by layer 22 which serves as a spacer layer between them. Product 40 also includes an additional layer, 22', bounding the second metal layer This product 40 could be varied to provide layer 22 or 22' as a two part layer of this invention. However, as noted on the comparison of products 20 and 30, this added complexity is not commonly required. This sort of multilayer product can be used in the same setting as would products 10 or 20. It would be expected to offer advantages in optical settings where it would give more sharply defined bands of transmission and reflection.

Manufacturing Information

The multilayer dielectric layers and metal layer products incorporating them are prepared using sputtering techniques. The metal layer is deposited using conventional sputtering equipment and methodology.

When the first and second layers of the multilayer dielectric layers are very thin, i.e. at the very low end of their thickness may be laid down as metal layers and then up-oxidized into a dielectric state. This may be done one layer at a time or may be done with multiple layers at a time. This might be done by laying down the metal for the first dielectric from a first metal cathode followed by laying down the mixed metals for the second or outer dielectric layer from a metal alloy cathode with a magnetron sputterer and an inert sputtering gas such as argon and then converting the laid-down metals to the desired dielectric compounds by reaction with oxygen or a mixture of oxygen and nitrogen with optional hydrogen addition.

More commonly, however, the two dielectric compounds are laid down by direct reactive sputtering. In this method the sputtering cathode is the dielectric metal or alloy of metals depending upon which layer is being formed. The cathode is sputtered using reactive gas (oxygen, nitrogen, and hydrogen) and optionally an inert sputtering gas such as argon to give the desired layer of one or more dielectric compounds.

The thickness of the various layers is controlled by varying the voltage and current fed to the electrode targets, the gas flow rates and, in the case of continuous systems where the substrate and sputtering target move relative to one another, the speed at which the substrate is moved past the target.

If desired, the lay down of the first metal layer or (if present) the dielectric layers under the metal layer can be preceded by a mild preglow treatment of the substrate to improve adhesion.

Figure 5:
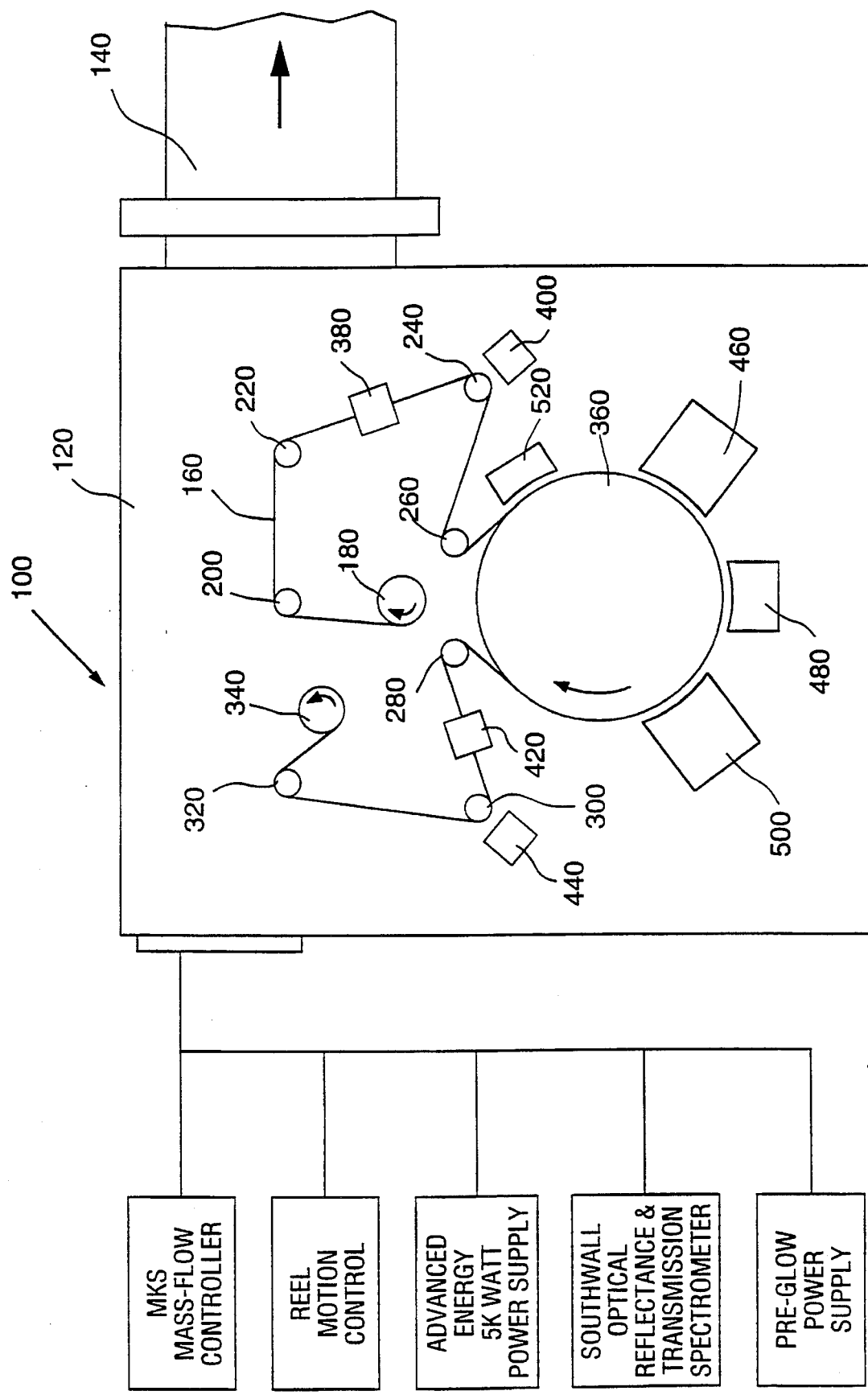
FIG. 5 shows a continuous web coating sputtering machine useful for forming materials of this invention.

A sputter deposit apparatus suitable for laying down these various antireflection layers is shown in FIG. 5. Sputter-depositing is a commercial process for depositing inorganic materials, metals, oxynitrides, oxides, and the like on surfaces. Representative descriptions of sputter-depositing processes and equipment may be found in U.S. Pat. Nos. 4,204,942 and 4,948,087, which are incorporated by reference.

In sputtering, a voltage is applied to a metal or metal compound sputtering cathode in the presence of a reactive or nonreactive gas to create a plasma. The action of the sputtering gas plasma on the cathode causes atoms of the cathode (target) to be dislodged and to travel and to deposit upon a substrate positioned adjacent to the sputtering source.

Typically the sputtering gas is a noble gas such as krypton or argon or the like. Argon is the most common sputtering gas because of its attractive cost. It is also known in the art to employ from about 1% to about 90% (or even 100% in some cases) of one or more reactive gases as components of a sputtering gas mixture.

When a reactive gas is present, it can cause a metal to be deposited as a compound such as an oxide when an oxygen source is present and the like. This reactive sputtering process is well known and used commercially.

As applied to the present invention, the first dielectric metal layer is preferably deposited as dielectric using a cathode of indium, tin or zinc or the like and a sputtering gas including oxygen, and optionally nitrogen and/or hydrogen to give the desired oxide. The second half of the multilayer dielectric is laid down using an alloy target of, for example, tin and indium together with a reactive gas.

FIG. 5 shows a continuous web coating sputtering machine. The web coating system is shown as system 100 in FIG. 5. System 100 includes vacuum chamber 120 which is evacuated via line 140. Contained within chamber 120 is a drive mechanism for moving a sheet of flexible polymer substrate 160 past a series of magnetron sputtering stations 500, 480, and 460. The drive mechanism includes feed roll 180, idlers 200, 220, 240, 260, 280, 300 and 320 and take-up roll 340.

The film passes around chilled idler drum 360 as well. The film passes a pair of monitors for determining its transmittance, 380, and reflectance, 400, before coating and a similar pair of monitors 420 and 440 after coating. This coater is configured to simultaneously sputter coat up to three layers on the web using three separate DC magnetron cathodes 460, 480 and 500. To produce a product as shown in FIG. 1., cathode 460 is used to lay down the metal layer; cathode 480 is used to lay down the first dielectric layer and cathode 500 can be used to lay down the second dielectric layer. Also located in the system is a pre-glow station 520 for optional ionized gas cleaning or surface modifying of the substrate before coating. Each of these four stations is isolated from each other in space as a mini-chamber (See U.S. Pat. No. 4,298,444); thereby producing a local environment for the containment of the various plasma gasses. This allows separate processes to be carried out simultaneously at each station with variations in atmosphere from station to station but with minimal cross-contamination among the four sources.

The control and monitoring of the sputtering system are normally accomplished using equipment and sensors which are standard in this type of coating machine. These are shown in FIG. 5 and include: 1) mass flow controllers (MKS) for regulation of gas flow into the cathode mini-chambers; 2) 5–10 kilowatt DC power supplies (Advanced Energy) for all three sputtering cathodes; 3) an optical monitoring system (Hexatron/Southwall Technologies) which measures both reflectance and transmission of the film over the spectral region from 400 to 2000 nm; and 4) a film motion control system (Drivex) which regulates the tension, speed, and distance of the film as it moves through the system.

EXAMPLES AND DESCRIPTION OF PREFERRED EMBODIMENTS

In this section the preparation and testing of materials of this invention will be demonstrated together with a description of the nature and performance of preferred embodiments of the invention.

When tested in salt fog exposure (i.e., aqueous 5% NaCl solution as described in ASTM B-117), thin film optical stacks composed of alternating silver and indium oxide layers (i.e., dielectric/silver/dielectric or DMD, DMDMD, etc.) corrode in about 1.5 hours. The primary corrosion sites in these structures occur in the silver layer(s), which display chemical reactivity with the salt fog and debonding from adjacent oxide layers. The degree of corrosion is measurable as both an increase in sheet resistance and decrease in visible transmission.

For applications where the above-described optical stacks cannot be isolated from corrosive elements, an improved corrosion resistant stack is desired.

When an alloyed silver is substituted for the unalloyed silver in these structures, corrosion resistance (i.e., the period before detectable changes are observed) can be increased from about 1.5 hours to about 12 hours. When silver is alloyed with a minor proportion of gold the primary corrosion sites no longer occur in the silver layer(s). Instead, the top indium oxide layer becomes the primary corrosion site and displays surface degradation. The degree of corrosion is measurable at about 12 hours as a decrease in visible transmission or an increase in sheet resistance.

The preferred application of the present double overlayer invention is with an alloyed silver material. In this setting, the double overlayer has the ability to extend the corrosion resistance of the alloyed silver structure made with indium oxide to greater than 96 hours of corrosive salt fog exposure before substantial changes in optical or resistance properties occur.

In this preferred embodiment the double overlayer is made up of a dense, nonporous dielectric layer such as indium oxide or zinc oxide overcoated with an alloyed oxide layer which is chemically inert based on indium/tin oxide. The alloyed oxide metal ratio is nominally 1:1 indium to tin.

In this preferred embodiment, a primarily nonporous indium oxide first layer is coated with an inert indium/tin oxide second layer 25 Å to 400 Å thick. The primary indium oxide layer is adjusted in thickness to maintain the desired optical properties of the thin film structure but the indium oxide layer is not eliminated.

This preferred embodiment illustrates two advantages achieved by the present invention:

(1) After exposure to salt fog, the adhesion of the indium oxide layer to the alloyed silver layer is greater than in other structures with different dielectric layers (i.e. monolithic indium oxide, monolithic indium/tin oxide and monolithic tin oxide).

(2) Degradation of the top dielectric stack layer during salt fog exposure is minimized as observed in the number, size, and type of defects. Both monolithic indium oxide and monolithic indium/tin oxide layers have greater numbers of defects than observed with the double overcoat of the invention. However, a monolithic indium/tin oxide layer still has substantially fewer defects than a monolithic indium oxide layer.

Sample Preparation

A roll of 0.003 inch thick PET (ICI 393) was loaded into a roll sputtering machine as depicted in FIG. 5. An indium/tin (50%/50%) target (ca 5 inches×15 inches) is installed into the position marked as 460 in FIG. 5. After pumping down to $2\times10^{-5}$ Torr, argon, oxygen, hydrogen, and nitrogen flows of 4.0, 35.9, 16.3, and 5.0 sccm respectively were introduced into the minichamber to obtain a pressure of $4.7\times10^{-3}$ Torr. Reactive sputtering was done with −345 volts applied to the target to obtain a current of 16.0 Amps. The PET substrate was moved at a line speed of 9.9 millimeters/sec.

At the same time, a silver/gold target was present in position 480. Argon was introduced into the 480 minichamber at a flow of 10.3 sccm to obtain a pressure of $4.7\times10^{-3}$ Torr. Sputtering was carried out with −503 volts applied to the target to obtain a current of 0.94 Amps.

An indium target was present in position 500. Argon, oxygen, hydrogen, and nitrogen flows of 4.0, 23, 22, and 5.0 sccm respectively were introduced into its minichamber to obtain a pressure of $3\times10^{-3}$ Torr. Reactive sputtering was done with negative −317 volts applied to the target to obtain a current of 8.8 Amps. The product was rewound.

A 50%/50% indium/tin target was then installed in position 500. After pumping down, argon, oxygen, hydrogen, and nitrogen flows of 4.0, 45.9, 43.7, and 5.0 sccm respectively were introduced into the minichamber to obtain a pressure of $7.0\times10^{-3}$ Torr. The product was re-fed past position 500. Reactive sputtering was done with −333 volts applied to the target to obtain a current of 16.7 Amps.

This gave rise to a representative product of the invention having the following structure or "stack":

Indium/tin oxide—50 angstroms
   Indium oxide—250 angstroms
   Silver/gold—100 angstroms
   Indium oxide—250 angstroms
     PET.

Comparative preparations were carried out varying the targets and their operation conditions so as to obtain materials containing only one of the two top layers and the like. These products in accord and not in accord with the invention were then tested.

Testing Procedures

The thin film optical stacks were tested for corrosion rates as follows. Samples 2.5 inches square were cut from laboratory rolls and placed on glass plates in a salt fog chamber with the coated side of the sample exposed to the fog. The samples were exposed continuously to the salt fog and one set of two samples of each material system was removed after time intervals of up to 96 hours.

After completing exposure, the samples were rinsed in DI water for 30 seconds, patted dry, and labeled. The visible transmittance, sheet resistivity, and film adhesion properties were measured on each sample. Tvis was measured on a Gardner Spectrogard (2 degree observer, Illuminant C) with the coated side of the sample mounted against the integrating sphere. A minimum of three measurements were made per sample. Sheet resistance was measured on an LEI conductance monitor. A minimum of four measurements were made per sample.

The tape test used to determine coating adhesion is the standard, crosshatch tape test used in the thin film industry (ASTM D3358 or D3359-87). Two series of parallel scribes are made which cut through this coating and down to the substrate. The first and second series of scribes are cut with a 90-degree angle between them. Clear one inch wide 3M 610 tape is pressed in contact with the surface. The tape is removed by peeling it away at a 90-degree angle to the sample surface. The percent film removed in each scribed square is recorded.

The salt fog test conforms to the ASTM B-117 procedure with a temperature of 95 degrees F. and a sodium chloride concentration of 5%.

Corrosion Testing Observations

All observations below refer to samples that were weathered as noted above. Visible inspection of sample degradation was made using the unaided eye and an optical microscope providing up to 1000 times magnification.

(A) The degradation in DMD structures made with unalloyed silver and indium oxide is characterized by blistering of the film away from the substrate and occurs in about 1.5 hours of exposure. The blistering occurs in the silver layer and is characterized by film discoloration, cracking, and lifting. Increased salt fog exposure time increases both the number of these blisters and the blister size. Adhesion failure occurs only at the blister locations with the tape removing the blistered film including the silver layer(s).

(B) The degradation in DMD structures made with alloyed silver and indium oxide is characterized by etching of the top dielectric layer and occurs in about 12 hours of exposure. Etching is defined as the appearance of surface features characterized by shallow depth, random swirling pattern, and discoloration. This etching covers the entire top dielectric layer surface. This etching is the degradation primarily responsible for the visible transmission change at about 12 hours of exposure. Although not visibly observed, there is some degradation of the metallic layer to account for the beginning of sheet resistivity changes. However, the stack layers do not delaminate. Adhesion failure in alloyed silver structures is not observed.

(C) The degradation at about 96 hours of exposure in DMD structures made with alloyed silver, indium oxide, and incorporating the preferred embodiment of the invention (i.e., an indium tin oxide cap) is characterized by pinpoint defects in the top dielectric layer. The density (i.e., counts per unit area) of dots and size of dots increase with increased salt fog exposure time.

For a monolithic indium/tin oxide top dielectric layer, the primary structural change was the formation of small, irregular blotches on the film surface. As discussed above, in the preferred embodiment of the invention, the primary structural change was the formation of pinpoint defects in the top dielectric stack. The density of the dots and the cross-sectional size is substantially reduced in comparison to the monolithic indium/tin oxide top dielectric layer.

Figure 6:
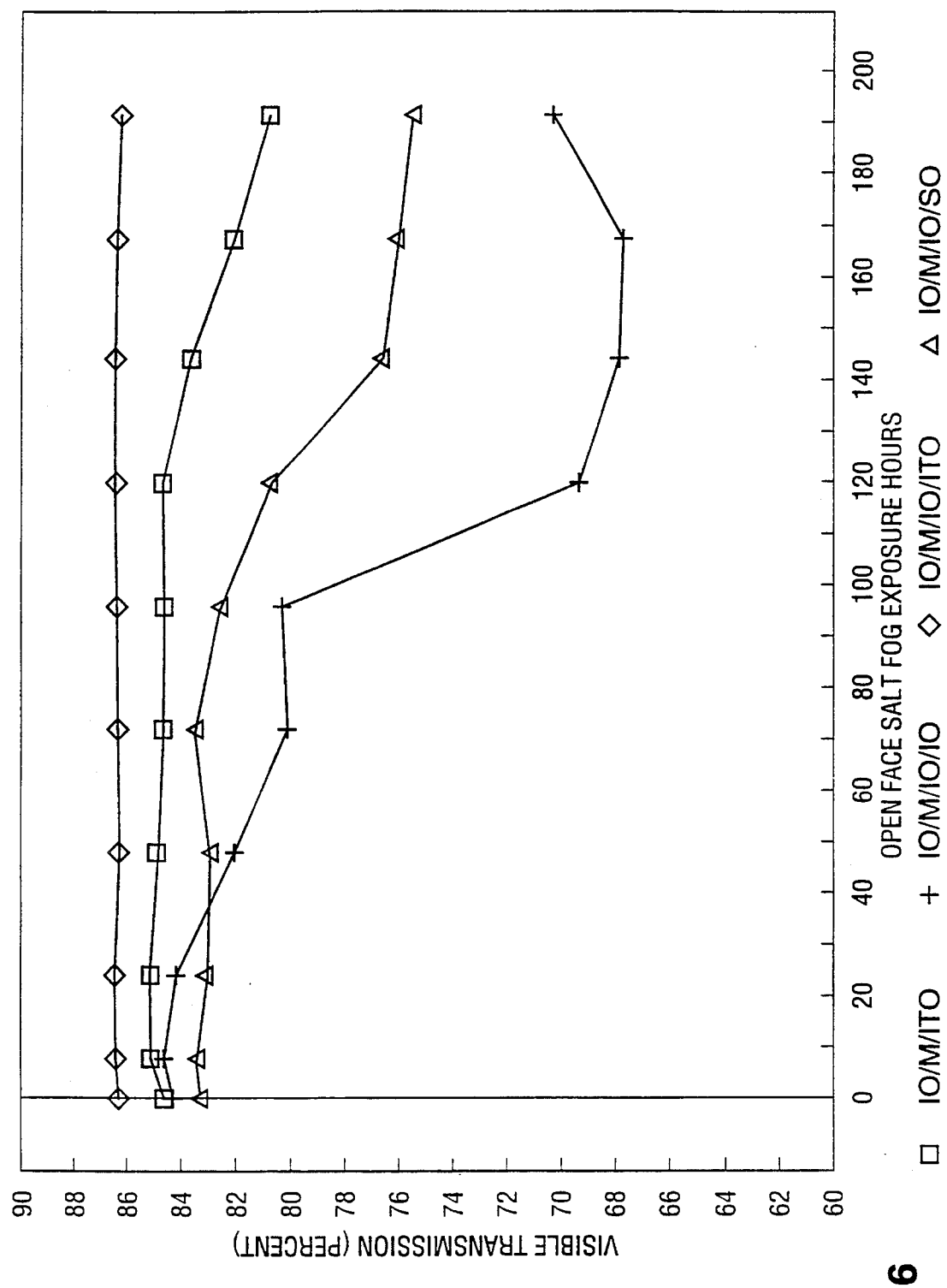
FIGS. 6 and 7 are graphs illustrating the relative performance of products which incorporate and do not incorporate the double dielectric layer of the present invention as measured by changes in visible transmittance and sheet resistance, respectively.

After 96 hours of exposure, the invention samples decreased by less than 1 percentage point in Tvis (from about 85 to 84.5% Tvis) while the standard indium oxide structure decreased from 4 to 10 percentage point in Tvis (from about 86 to 76% Tvis). FIG. 6 is a graph illustrating this degradation in optical properties which is avoided by the practice of this invention.

After 96 hours of exposure, the invention samples increased by 25% in sheet resistivity (from about 20 to 25 ohm/sq) while the standard indium oxide structure increased by over 150% (from about 20 to 50 ohm/sq). This is illustrated in FIG. 7.

After 96 hours salt fog exposure, adhesion failure does not occur in any samples made in accord with this invention.

However, for structures where the entire thickness of the top indium oxide dielectric layer is replaced by indium tin oxide, adhesion failure is observed with the tape test. It is characterized by removal of the top dielectric layer in random patches with the alloy silver layer remaining intact. The monolithic InSnOx film showed about 20% film loss (by area) using the tape test.

Figure 7:
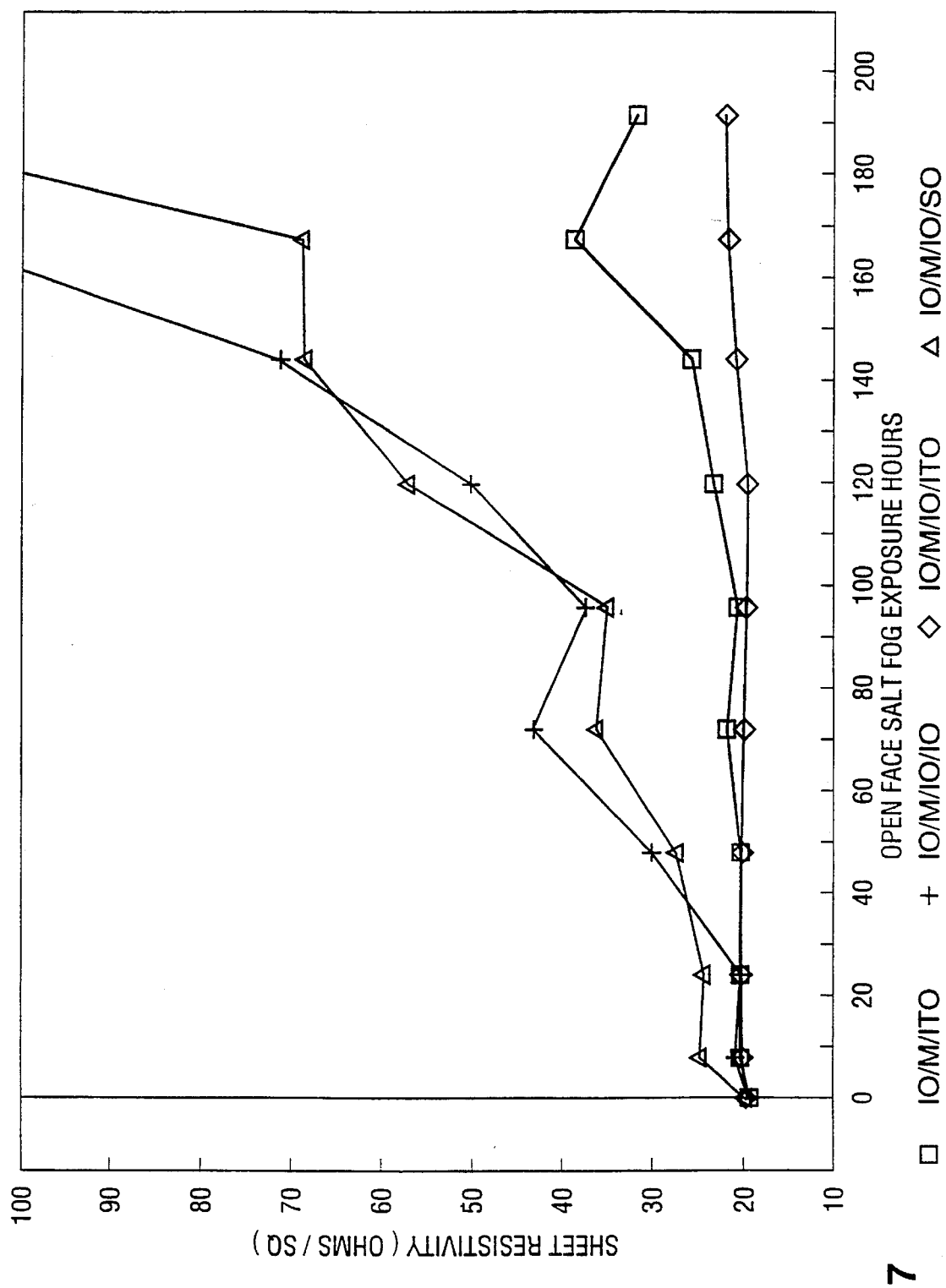

These results are summarized in Table 1 and in FIGS. 6 and 7. They demonstrate conclusively that a stack employing the double layer of this invention is much less prone to corrosion than an equivalent stack made with the same total thickness of either of the two stack components alone.

TABLE 1

ITO CAPPING: SUMMARY OF MOST SIGNIFICANT SAMPLES

| SAMPLE NUMBER LC1-23- | COATING STRUCTURE | ADHESION % REMOVAL AFTER 96 HRS SALT FOG | PHYSICAL APPEARANCE AFTER 96 HRS SALT FOG |
| --- | --- | --- | --- |
| 149-1 | IO/M/ITO | 20% | A few corosion spots. |
| 49-2 | IO/M/IO/IO | 60-70% | Blotchy corrosion over 50% surface. Elsewhere scratched. |
| 149-4 | IO/M/IO/ITO | 0% | Entire surface remained clear. |
| 48-4 | IO/M/IO/SO | 20-30% | Uniform grey mottled corrosion over entire surface. |

NOTES:
1) Definitions
IO = indium oxide
ITO = indium tin oxide with metal weight ratio of 1:1.
SO = Tin Oxide
M = metal layer of 15 wt % Au in Ag
2) Salt Fog Exposure: 5 % NaCl at 95° F. as per ASTM B117.
3) Adhesion: Cross hatch peel tex as per ASTM D3358.

What is claimed is:

1. In a coating having a 10 to 3000 Å thick layer of metal selected from the group consisting of silver, copper, and combinations of silver and copper with one another and with noble metals with an overlayer of dielectric, the improvement comprising employing as the overlayer a mixed material having a first layer adjacent to the layer of metal composed substantially of dielectric selected from the group consisting of indium oxide, zinc oxide and mixed indium/zinc oxide dielectric and a second layer adjacent to the first and composed substantially of mixed indium/tin oxide dielectric.

2. The improved coating of claim 1 wherein the first layer is at least about 100 Å thick and the second layer is at least about 25 Å thick.

3. The improved coating of claim 1 wherein the first layer is composed substantially of indium oxide dielectric.

4. The improved coating of claim 3 wherein the first layer consists essentially of at least 90% indium oxide dielectric plus from 0 to 10% of dielectric based on one or more elements selected from the group consisting of tantalum (Ta), niobium (Nb), titanium (Ti), hafnium (Hf), tungsten (W) zirconium (Zr) molybdenum (Mo) and silicon (Si).

5. The improved coating of claim 4 wherein said 0 to 10% of dielectric of the first layer is oxides.

6. The improved coating of claim 1 wherein the first layer is composed substantially of zinc oxide dielectric.

7. The improved coating of claim 6 wherein the first layer consists essentially of at least 90% zinc oxide dielectric plus from 0 to 10% of dielectric based on one or more elements selected from the group consisting of tantalum (Ta), niobium (Nb), titanium (Ti), hafnium (Hf), tungsten (W) zirconium (Zr) molybdenum (Mo) and silicon (Si).

8. The improved coating of claim 7 wherein said 0 to 10% of dielectric of the first layer is oxides.

9. The improved coating of claim 1 wherein the first layer is composed substantially of mixed indium/zinc oxide dielectric.

10. The improved coating of claim 9 wherein the first layer consists essentially of at least 90% mixed indium/zinc oxide dielectric plus from 0 to 10% of dielectric based on one or more elements selected from the group consisting of tantalum (Ta), niobium (Nb), titanium (Ti), hafnium (Hf), tungsten (W) zirconium (Zr) molybdenum (Mo) and silicon (Si).

11. The improved coating of claim 10 wherein said 1 to 10% of dielectric of the first layer is oxides.

12. The improved coating of claim 1 wherein the second layer consists essentially of at least 90% of a 20%/80% to 80%/20% mixed indium/tin oxide dielectric and o to 10% of dielectric based on one or more elements selected from the group consisting of tantalum (Ta), niobium (Nb), titanium (Ti), hafnium (Hf), tungsten (W) zirconium (Zr) molybdenum (Mo) and silicon (Si).

13. The improved coating of claim 12 wherein said 0 to 10% of dielectric of the second layer are oxides.

14. The improved coating of claim 1 wherein the layer of metal is a combination of silver with from 1% to 20% of gold, the first layer consists essentially of at least about 100 Å of indium oxide and the second layer consists essentially of at least about 25 Å of a 20%/80% to 80%/20% mixed indium/tin oxide.

15. The improved coating of claim 14 wherein the layer of metal comprises silver alloyed with 1–20% of gold.

16. The improved coating of claim 14 wherein the layer of metal comprises silver clad with 1–20% of gold.

17. The improved coating of claim 1 additionally comprising a layer of dielectric beneath the layer of metal.

* * * * *